US011522304B2

(12) United States Patent
Jones et al.

(10) Patent No.: US 11,522,304 B2
(45) Date of Patent: *Dec. 6, 2022

(54) MODULAR CIRCUIT BOARD MULTI-TAP

(71) Applicant: PPC BROADBAND, INC., East Syracuse, NY (US)

(72) Inventors: Douglas Jones, Cicero, NY (US); Noah Montena, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/935,325

(22) Filed: Jul. 22, 2020

(65) Prior Publication Data

US 2020/0350710 A1 Nov. 5, 2020

Related U.S. Application Data

(63) Continuation of application No. 16/226,982, filed on Dec. 20, 2018, now Pat. No. 10,784,597.

(Continued)

(51) Int. Cl.
*H01P 5/18* (2006.01)
*H03H 9/74* (2006.01)
(Continued)

(52) U.S. Cl.
CPC ............. *H01R 9/0509* (2013.01); *H01P 5/18* (2013.01); *H01R 13/5213* (2013.01);
(Continued)

(58) Field of Classification Search
CPC ... H01P 5/18; H04N 7/10; H03H 7/48; H03H 9/74; H01R 9/0509; H01R 13/5213; H01R 24/547; H01R 31/02; H01R 43/26
(Continued)

(56) References Cited

U.S. PATENT DOCUMENTS 4,578,702 A  3/1986  Campbell, III
4,963,966 A  10/1990  Harney
(Continued)

OTHER PUBLICATIONS

Young, Lee W. (Authorized Officer), International Search Report and Written Opinion dated Mar. 21, 2019, PCT Application No. PCT/US2018/066723, filed Dec. 20, 2018, pp. 1-12.

*Primary Examiner* — Rakesh B Patel
(74) *Attorney, Agent, or Firm* — MH2 Technology Law Group LLP

(57) ABSTRACT

A multi-tap device for a cable television (CATV) system includes a tap housing and a faceplate configured to be connected to the tap housing. The device also includes a first circuit board configured to be connected to the tap housing. The device also includes a second circuit board configured to be connected to the faceplate and to the first circuit board. The device also includes an access cover connected to the tap housing. The access cover is configured to be opened to provide access to disconnect the first circuit board from the tap housing and from the second circuit board and to subsequently remove the first circuit board from the tap housing, thereby changing a tap value of the multi-tap device. The second circuit board is configured to remain connected to the faceplate and positioned within the tap housing when the first circuit board is removed from the tap housing.

35 Claims, 4 Drawing Sheets

Related U.S. Application Data

(60) Provisional application No. 62/613,484, filed on Jan. 4, 2018.

(51) Int. Cl.
*H01R 9/05* (2006.01)
*H01R 13/52* (2006.01)
*H04N 7/10* (2006.01)
*H01R 43/26* (2006.01)
*H01R 31/02* (2006.01)
*H01R 24/54* (2011.01)
*H01R 24/52* (2011.01)

(52) U.S. Cl.
CPC ........... *H01R 24/52* (2013.01); *H01R 24/547* (2013.01); *H01R 31/02* (2013.01); *H01R 43/26* (2013.01); *H03H 9/74* (2013.01); *H04N 7/104* (2013.01); *H01R 2201/18* (2013.01)

(58) Field of Classification Search
USPC .................................................. 333/109, 112
See application file for complete search history.

(56) References Cited

U.S. PATENT DOCUMENTS

| | | | |
|---|---|---|---|
| 6,133,939 | A | 10/2000 | Gresko |
| 6,292,371 | B1 | 9/2001 | Toner, Jr. |
| 6,570,465 | B2 | 5/2003 | Tang |
| 10,784,597 | B2 * | 9/2020 | Jones .................. H01R 9/0509 |
| 2004/0086110 | A1 | 5/2004 | Singaliese et al. |
| 2005/0078918 | A1 | 4/2005 | Wang |
| 2012/0044361 | A1 | 2/2012 | Riggsby |
| 2015/0067755 | A1 | 3/2015 | Conroy |
| 2015/0130555 | A1 | 5/2015 | Li |
| 2015/0236460 | A1 | 8/2015 | Ariesen |
| 2017/0099100 | A1 | 4/2017 | Bush et al. |
| 2020/0036938 | A1 | 1/2020 | Jones |

* cited by examiner

MODULAR CIRCUIT BOARD MULTI-TAP

CROSS-REFERENCE TO RELATED APPLICATIONS

This application is a continuation of U.S. patent application Ser. No. 16/226,982, filed on Dec. 20, 2018, which claims priority to U.S. Provisional Patent Application No. 62/613,484, filed on Jan. 4, 2018. The entirety of both applications is incorporated by reference.

BACKGROUND

In present cable television (CATV) operating systems, television and data signals are transmitted from a main source known as the "headend" to remote subscribers (e.g., at a household). The signal communication may be unidirectional (i.e., a one-way, downstream transmission from the headend to the subscriber). In such systems, the transmitted signal is generated from a single source, permitting cable operators to maintain high-quality signals for reception by the subscribers through use of tight tolerances, high-quality shielding, and forward equalization to maintain reliable transmission.

Recent advances in cable television have allowed subscribers to become interactive (i.e., to transmit upstream return signals back to the headend). As a result, many cable systems now provide an active return path. However, the signals in the return path may generate noise, and the noise aggregates from all subscribers generating return signals at a given time. The three primary sources of noise generated in the return path of a bidirectional cable television operating system are thermal noise, ingress, and fiber link noise. As a result, it is difficult to maintain a high-quality return path, because the cable operator cannot maintain any meaningful control of the return signal from each subscriber.

Multi-tap devices may provide the function of directional coupling to provide a desired level of attenuation for the signals tapped off to the subscribers. Because of this, taps are typically provided with multiple values of directional coupling based off where they are positioned in the distribution line. In addition, the multi-tap devices are now used to provide the function of equalization to reduce noise in the signals. Such multi-tap devices permit a user to select a single plug-in for providing a desired equalization function. Multi-tap devices often include a tap housing with a removable faceplate. The faceplate includes a directional coupler, a receptacle for a plug-in module, a splitter, and connections for subscriber tap ports (also known as F-ports). The removable faceplate has a printed circuit board attached permanently thereto. This allows the faceplate to be removed without interrupting the downstream signal (e.g., to the subscriber). However, this requires a technician to disconnect all of the drop-connections when the tap value needs to be changed, which represents an undesirable interruption of service. Furthermore, it requires significant additional inventory since users may need to stock all possible directional coupling values for each tap configuration.

SUMMARY

A multi-tap device for a cable television (CATV) system is disclosed. The device includes a tap housing configured to be installed at a subscriber premises. The device also includes a faceplate configured to be connected to the tap housing. The device also includes a first circuit board configured to be connected to the tap housing. The device also includes a second circuit board configured to be connected to the faceplate and to the first circuit board. The device also includes an access cover connected to the tap housing. The access cover is configured to be opened to provide access to disconnect the first circuit board from the tap housing and from the second circuit board and to subsequently remove the first circuit board from the tap housing, thereby changing a tap value of the multi-tap device. The second circuit board is configured to remain connected to the faceplate and positioned within the tap housing when the first circuit board is removed from the tap housing.

In another embodiment, the device includes a tap housing. The device also includes a first circuit board configured to be positioned within the tap housing. The device also includes a second circuit board configured to be positioned within the tap housing. The device also includes an access cover configured to be connected to the tap housing. The access cover is configured to be opened to provide access to remove the first circuit board from the tap housing. The second circuit board is configured to remain positioned within the tap housing when the first circuit board is removed from the tap housing. A method for changing a tap value of a multi-tap device is disclosed. The multi-tap device includes a tap housing, a tap faceplate circuit board, and an access cover. The method includes opening the access cover to provide access to a first directional coupler (DC) circuit board in the tap housing. The method also includes removing the first DC circuit board from the tap housing while the access cover is opened. The tap faceplate circuit board is configured to remain positioned within the tap housing when the first DC circuit board is removed from the housing. The method also includes positioning a second DC circuit board in the tap housing after the first DC circuit board has been removed from the tap housing. The second DC circuit board has a different tap value than the first DC circuit board.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

Embodiments of the present disclosure may provide a distribution multi-tap device that includes a tap housing (also referred to as a tap plate). A directional coupler (DC) circuit board and a tap faceplate circuit board may be connected to and/or positioned in the tap housing. The DC circuit board may be removable (i.e., it may be disconnected and separated from the tap housing and/or the tap faceplate circuit board). This may allow the tap value of the device to be changed without having to remove the existing faceplate and/or disconnect the drop connections to the subscriber tap ports.

In one embodiment, the device may include a DC circuit board that may be connected to and/or positioned in the tap housing and is removable therefrom. The DC circuit board may include one or more (e.g., two) receptacles to connect the tap housing to the DC circuit board as well as one or more (e.g., one) receptacle to connect to the DC circuit board to the tap faceplate circuit board. The DC circuit board may also include one or more (e.g., one) receptacle for a plug-in signal-conditioning module. The tap faceplate may include a circuit board with one or more splitters and one or more subscriber tap ports (also known as F-ports). The tap faceplate circuit board may include a pin connection and/or a receptacle to accept a patch cord to connect the tap faceplate circuit board to the DC circuit board.

In another embodiment, the device may include a (e.g., DC) circuit board that may be connected to and/or positioned in the tap housing and is removable therefrom. The circuit board may include one or more (e.g., two) receptacles to connect to the tap housing to the circuit board as well as one or more (e.g., one) multi-pin receptacle to connect the circuit board to the tap faceplate circuit board. The circuit board may include a receptacle for a plug-in signal-conditioning module. The tap faceplate circuit board may include a pin connection and/or a receptacle to accept a patch cord to connect the faceplate circuit board to the circuit board. Splitting/separating the tap faceplate from the circuit board may provide benefits to the installer when changing tap values.

Figure 1:
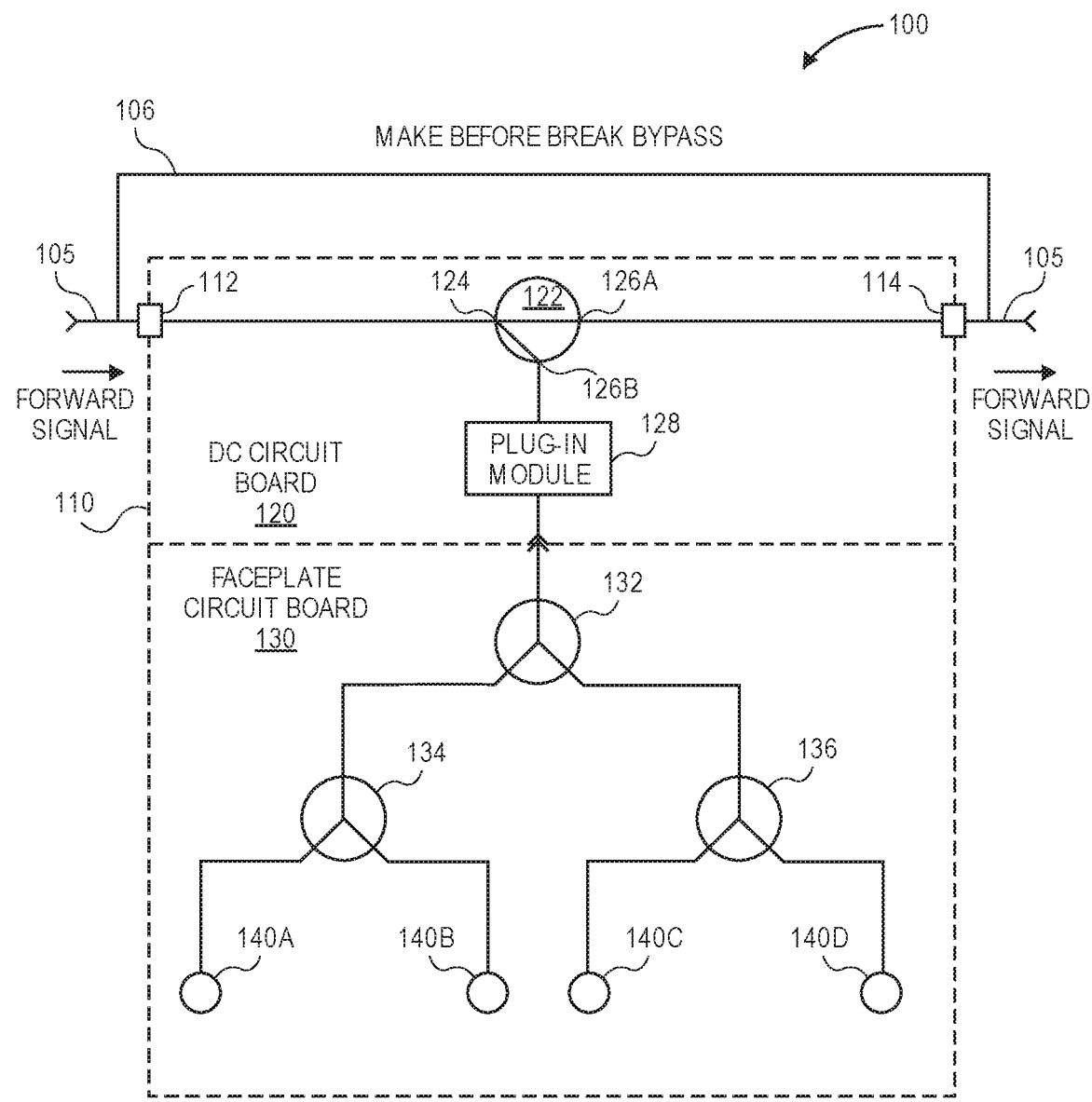
FIG. 1 illustrates a circuit diagram of a multi-tap device for a cable television (CATV) system, according to an embodiment.

FIG. 1 illustrates a circuit diagram of a multi-tap device 100 for a cable television (CATV) system, according to an embodiment. The device 100 may include a tap housing (also referred to as a tap plate) 110. The tap housing 110 may include one or more KS ports (e.g., an input port 112 and an output port 114). The input port 112 may be configured to connect to an upstream portion of a line 105 from a CATV source (e.g., the headend). The output port 114 may be configured to connect to a downstream portion of the line 105 to enable the signals to continue downstream. In at least one embodiment, a make-before-break bypass 106 may be connected to the ports 112, 114 and provide an alternate path around the multi-tap device 100.

A DC circuit board 120 may be removably connected to (i.e., configured to be disconnected from) and/or positioned in the tap housing 110. The DC circuit board 120 may be configured to be disconnected and/or removed from the tap housing 110, as described in greater detail below. The DC circuit board 120 may have a directional coupler 122 connected thereto to provide a desired level of attenuation for the signals tapped off to the subscribers. The directional coupler 122 may have one or more input ports (one is shown: 124) and one or more output ports (two are shown: 126A, 126B). The input port 124 may be configured to connect to the input port 112 of the tap housing 110 to enable the directional coupler 122 to receive signals from the CATV source. The first output port 126A may be configured to connect to the output port 114 of the tap housing 110 to enable the signals to continue downstream. The second output port 126B may be configured to connect to a plug-in module 128.

The plug-in module 128 may be configured to plug-in or otherwise connect to a receptacle in the DC circuit board 120. In another embodiment, the plug-in module 128 may include receptacles that may receive contacts on the DC circuit board 120. The plug-in module 128 may be configured to condition the signals passing therethrough. More particularly, the plug-in module 128 may be configured to equalize and/or filter the signals passing therethrough in one or both directions.

A tap faceplate circuit board 130 may also be connected to and/or positioned in the tap housing 110. The tap faceplate circuit board 130 may also be connected to the DC circuit board 120. The tap faceplate circuit board 130 may include one or more splitters (three are shown: 132, 134, 136). The first splitter 132 may be configured to connect to the directional coupler circuit board 120. More particularly, the first splitter 132 may be configured to connect to the plug-in module 128. The first splitter 132 may also be configured to connect to the second and third splitters 134, 136. The second splitter 134 may be configured to connect to one or more subscriber tap ports (two are shown: 140A, 140B). Similarly, the third splitter 136 may be configured to connect to one or more subscriber tap ports (two are shown: 140C, 140D).

Figure 2:
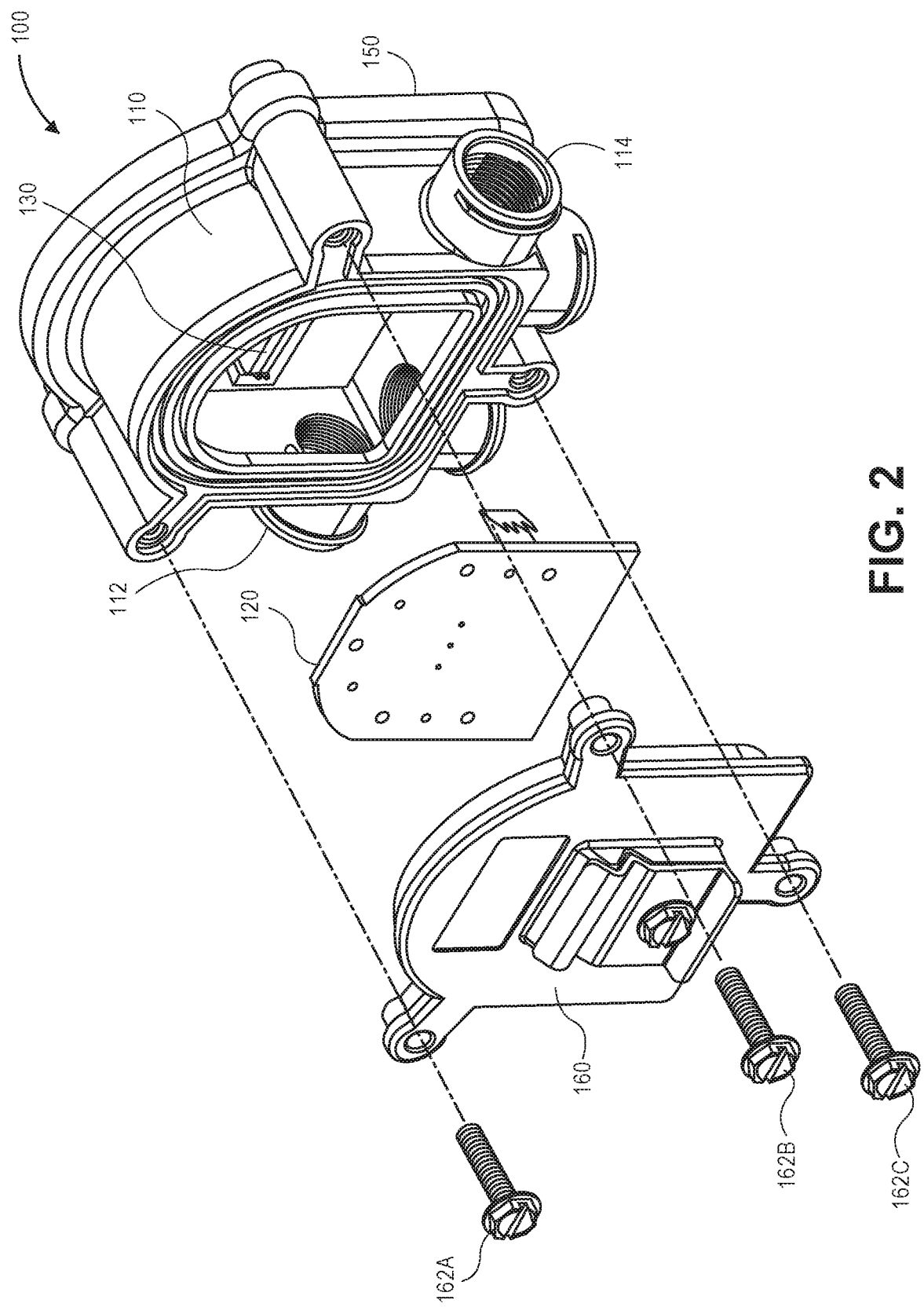
FIG. 2 and FIG. 3 illustrate exploded perspective views of the multi-tap device, according to an embodiment.
Figure 3:
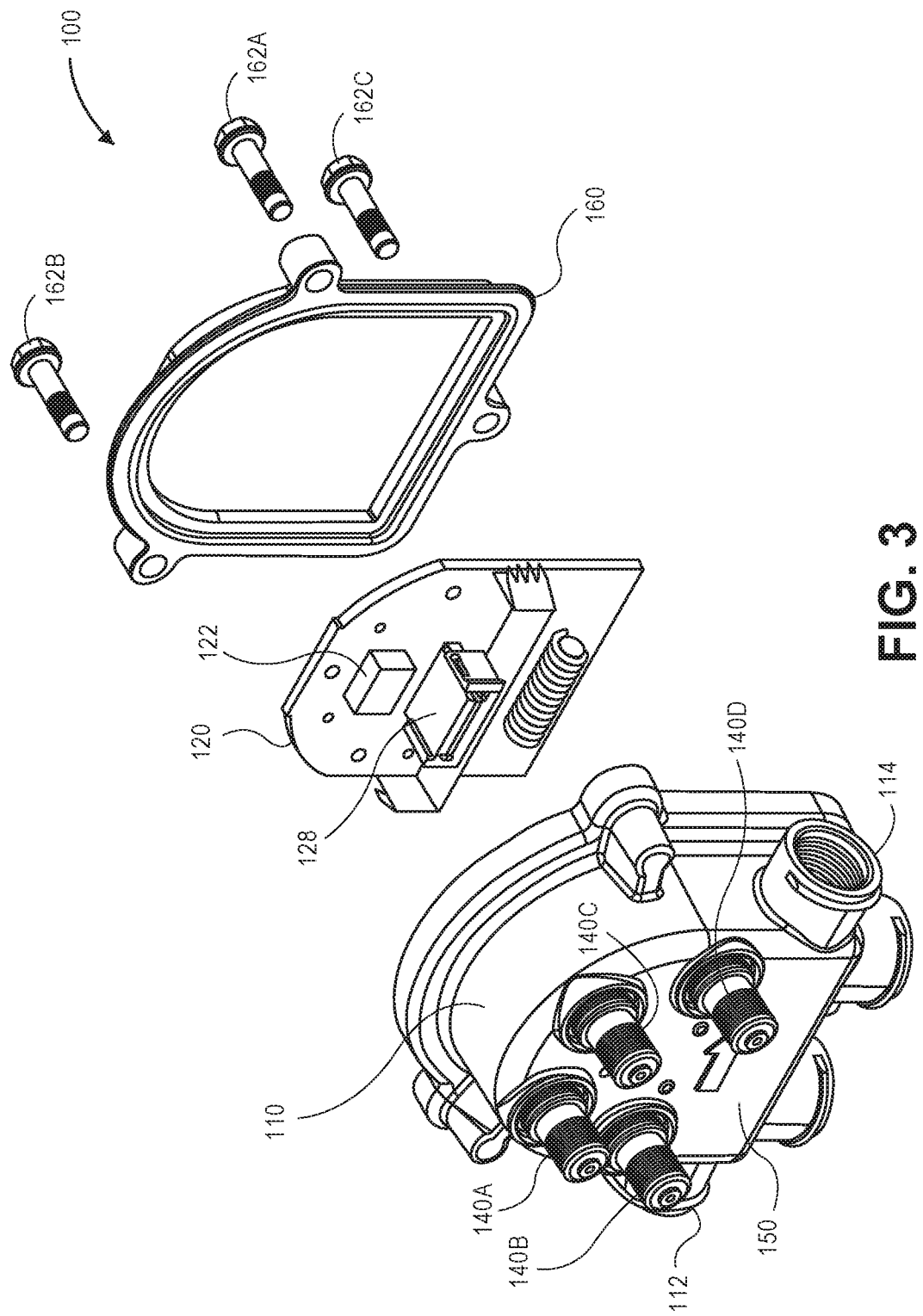

FIGS. 2 and 3 illustrate exploded views of the multi-tap device 100, according to an embodiment. As described above, the device 100 may include the tap housing 110, the DC circuit board 120, the plug-in module 128, the tap faceplate circuit board 130, and the subscriber tap ports 140A-D. The device 100 may also include a faceplate 150. In at least one embodiment, the faceplate 150 may be integral with the tap housing 110. Thus, the faceplate 150 may be referred to as non-removable with respect to (i.e., not configured to be disconnected from) the tap housing 110. The subscriber tap ports 140A-D may be mounted directly to the tap housing 110. More particularly, the subscriber tap ports 140A-D may be mounted directly to the faceplate 150.

The device 100 may also include an access cover 160 that is positioned on an opposing side of the tap housing 110 from the faceplate 150. The access cover 160 may be connected to the tap housing 110 via a plurality of fasteners (three are shown: 162A-C), e.g., screws, bolts, etc. In this embodiment, once the fasteners 162A-C are removed, the access cover 160 may be disconnected and moved laterally-away from the tap housing 110 to provide access to the components therein. In another embodiment, rather than using fasteners 162A-C, the access cover 160 may be secured in the closed state via a snap-fit arrangement, a tongue-in-groove arrangement, or the like with the tap housing 110.

Figure 4:
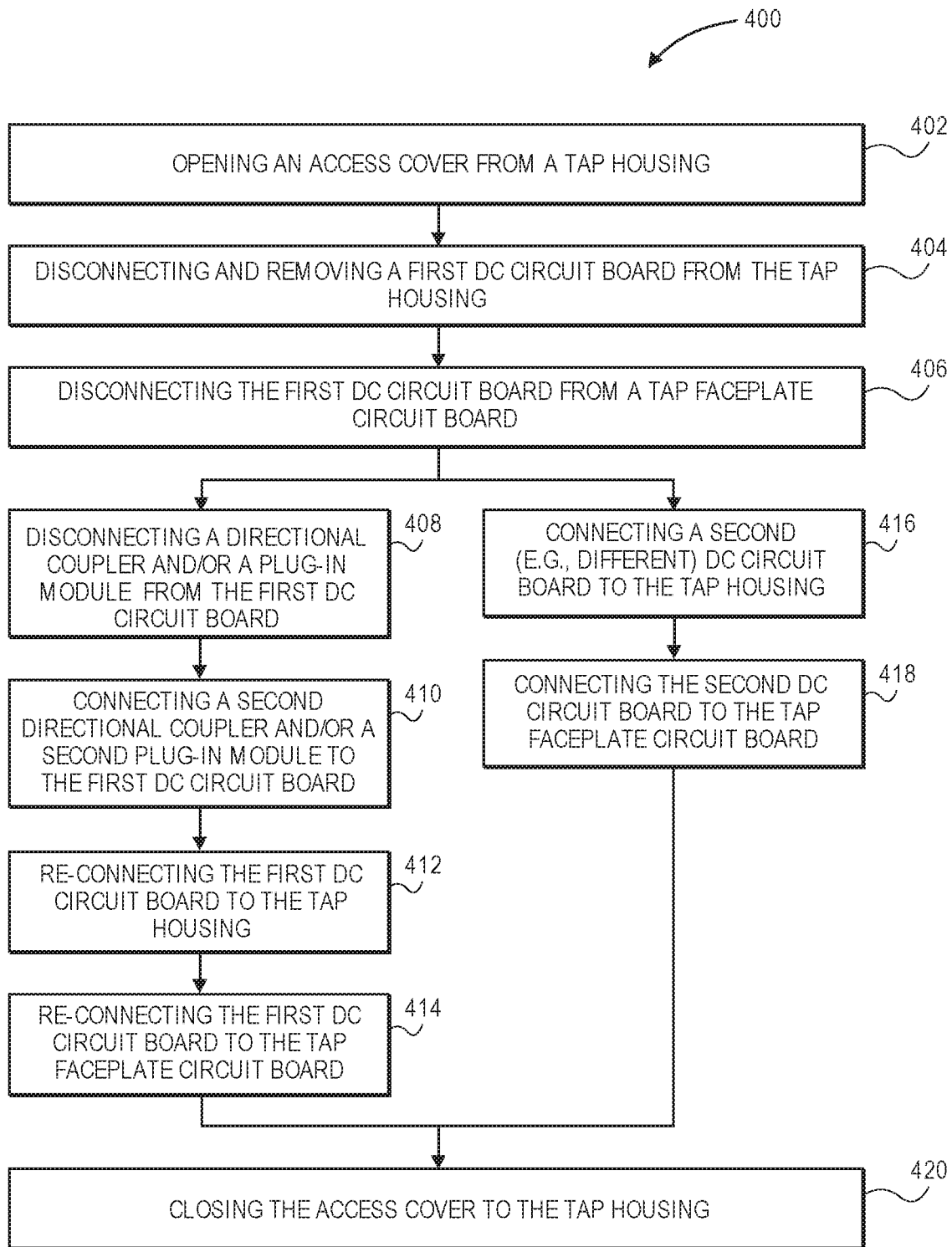
FIG. 4 illustrates a flowchart of a method for changing a tap value of the multi-tap device, according to an embodiment.

FIG. 4 illustrates a flowchart of a method 400 for changing a tap value of the multi-tap device 100, according to an embodiment. The method 400 may include opening the access cover 160 from the tap housing 110, as at 402. As will be appreciated, the faceplate 150 (with the subscriber tap ports 140A-D mounted thereon) may remain connected to or integral with the tap housing 110 when the access cover 160 is opened. As shown, opening the access cover 160 may include disconnecting and/or removing the access cover 160 from the tap housing 110. In another embodiment, the access cover 160 may be connected to the tap housing 110 by one or more hinges, and the access cover 160 may pivot around the hinge(s) to open the access cover 160.

Once the access cover 160 is opened, the method 400 may include disconnecting and removing a first DC circuit board 120 from the tap housing 110, as at 404. The bypass 106 may be active during this step to avoid interrupting downstream communication. In at least one embodiment, the first DC circuit board 120 may have a first directional coupler 122 and/or a first plug-in module 128 connected thereto when removed from the tap housing 110. In another embodiment, the first directional coupler 122 and/or the first plug-in module 128 may be disconnected from the first DC circuit board 120 and remain in the tap housing 110 when the first DC circuit board 120 is removed.

The method 400 may also include disconnecting the first DC circuit board 120 from the tap faceplate circuit board 130, as at 406. The first DC circuit board 120 may be disconnected from the tap faceplate circuit board 130 before, simultaneously with, or after it is disconnected from the tap housing 110. The tap faceplate circuit board 130 may remain connected to and/or positioned in the tap housing 110 when the first DC circuit board 120 is disconnected and removed.

When the first directional coupler 122 and/or the first plug-in module 128 are removed together with the first DC circuit board 120, the method 400 may also include disconnecting the first directional coupler 122 and/or the first plug-in module 128 from the first DC circuit board 120, as at 408. The method 400 may also include connecting a second directional coupler and/or a second plug-in module to the first DC circuit board 120, as at 410. The second directional coupler and/or the second plug-in module may be similar to the first directional coupler 122 and/or the first plug-in module 128 described above; however, the second directional coupler and/or the second plug-in module, when connected to the first DC circuit board 120, may change the tap value of the first DC circuit board 120.

The method 400 may also include re-connecting the first DC circuit board 120 (with the second directional coupler and/or the second plug-in module connected thereto) to the tap housing 110, as at 412. The method 400 may also include re-connecting the first DC circuit board 120 (with the second directional coupler and/or the second plug-in module connected thereto) to the tap faceplate circuit board 130, as at 414.

In an alternative embodiment to steps 408-414, the method 400 may include connecting a second (e.g., different) DC circuit board to the tap housing 110, as at 416. The method 400 may also include connecting the second DC circuit board to the tap faceplate circuit board 130, as at 418. The second DC circuit board may be similar to the first DC circuit board 120 described above; however, the second DC circuit board may have a different tap value (e.g., may condition signals differently) than the first DC circuit board 120. In at least one embodiment, the second DC circuit board may have the first directional coupler 122 and/or the first plug-in module 128 connected thereto. In another embodiment, the second DC circuit board may have the second (e.g., different) directional coupler and/or the second (e.g., different) plug-in module connected thereto, which may at least partially cause the second DC circuit board to have a different tap value than the first DC circuit board 120.

The method 400 may also include closing and/or re-connecting the access cover 160 to the tap housing 110, as at 420. The access cover 160 may be closed and/or re-connected after the first DC circuit board is re-connected (e.g., at steps 412, 414) or after the second DC circuit board is connected (e.g., at steps 416, 418). Any combination of the steps described above may be performed without disconnecting connections between the subscriber tap ports 140A-D and one or more subscriber devices, due to the ability to remove the access cover 160 and the first DC circuit board 120 while the faceplate 150 remains stationary. In other words, the connections to the subscriber tap ports 140A-D may remain intact throughout any combination of the steps. This is in contrast to conventional multi-tap devices, where connections to the subscriber tap ports are disconnected when the tap value is changed.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., " a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A multi-tap device for a cable television (CATV) system, comprising:
   a tap housing configured to be installed at a subscriber premises;
   a faceplate configured to be connected to the tap housing;
   a first circuit board configured to be connected to the tap housing;
   a second circuit board configured to be connected to the faceplate and to the first circuit board;
   an access cover configured to be connected to the tap housing;
   wherein the access cover is configured to prevent a tap value of the multi-tap device from being changed when the access cover is connected to the tap housing and permit the tap value of the multi-tap device to be changed when the access cover is removed from the tap housing so as to allow the first circuit board to be removed from the tap housing after the first circuit board has been disconnected from both the tap housing and the second circuit board;
   wherein the first circuit board and the second circuit board are configured to maintain electronic communication between a headend and with a subscriber network even when the access cover is first removed from the tap housing; and
   wherein the first circuit board is configured to remain connected to the second circuit board even when the access cover is removed from the tap housing.

2. The multi-tap device of claim 1, wherein the faceplate is integral with the tap housing, and wherein the access cover is positioned on an opposing side of the tap housing from the faceplate.

3. The multi-tap device of claim 1, wherein the faceplate is configured to be connected to one or more subscriber portions that remain connected to one or more subscriber devices while upon removal of the access cover the tap housing.

4. The multi-tap device of claim 3, wherein the second circuit board is connected to an inner side of the faceplate, and wherein the one or more subscriber tap ports are connected to an outer side of the faceplate.

5. The multi-tap device of claim 3, wherein the second circuit board comprises a splitter that is configured to remain connected to the one or more subscriber tap ports upon removal of the access cover from the tap housing.

6. The multi-tap device of claim 3, wherein the second circuit board comprises a splitter that is configured to be disconnected from the first circuit board when the first circuit board is removed from the tap housing.

7. The multi-tap device of claim 3, further comprising a plug-in signal-conditioning module that is configured to be connected to the first circuit board.

8. The multi-tap device of claim 7, further comprising a directional coupler configured to be connected to the first circuit board wherein the directional coupler comprises:
   an input port configured to be connected to an upstream portion of a line;
   a first output port configured to be connected to a downstream portion of the line; and
   a second output port configured to be connected to the plug-in signal-conditioning module.

9. The multi-tap device of claim 1, wherein the subscriber network and the headend maintain electronic communication between each other until the first circuit board is removed.

10. The multi-tap device of claim 7, wherein the second circuit board comprises:
    a first splitter configured to be connected to the plug-in signal-conditioning module; and
    a second splitter configured to be connected to the first splitter and to the one or more subscriber tap ports.

11. A multi-tap device for a cable television (CATV) system, comprising:
    a tap housing;
    a first circuit board configured to be positioned in a portion of the tap housing;
    a second circuit board configured to be positioned in a portion of the tap housing;
    an access cover configured to be connected to the tap housing;
    wherein the access cover is configured to be opened to provide access to remove the first circuit board from the tap housing; and
    wherein the first circuit board and the second circuit board are configured to maintain electronic communication between a subscriber network and a headend, upon removing the access cover from the tap housing.

12. The multi-tap device of claim 11, wherein the tap housing comprises a faceplate that is integral with, and non-removable from, a remainder of the tap housing.

13. The multi-tap device of claim 12, wherein the faceplate is positioned opposite to the access cover, such that the faceplate and the access cover face each other, and wherein the second circuit board is configured to be connected to an inner surface of the faceplate.

14. The multi-tap device of claim 12, further comprising one or more subscriber tap ports that are configured to be connected to the faceplate.

15. The multi-tap device of claim 14, wherein the first circuit board is configured to be removed from the tap housing without disconnecting connections between the one or more subscriber tap ports and one or more subscriber devices.

16. The multi-tap device of claim 15, wherein the subscriber network and the headend maintain electronic communication between each other until the first circuit board is removed.

17. The multi-tap device of claim 14, further comprising a plug-in signal-conditioning module that is configured to be connected to the first circuit board.

18. The multi-tap device of claim 17, wherein the second circuit board is configured to be connected to the first circuit board when the first circuit board is positioned within the tap housing, and wherein the second circuit board comprises one or more splitters; and wherein the one or more splitters include a first splitter configured to be connected to the plug-in signal-conditioning module; and a second splitter configured to be connected to the first splitter and to the one or more subscriber tap ports.

19. The multi-tap device of claim 17, further comprising a directional coupler configured to be connected to the first circuit board.

20. The multi-tap device of claim 19, wherein the directional coupler comprises:

an input port configured to be connected to an upstream portion of a line;
a first output port configured to be connected to a downstream portion of the line; and
a second output port configured to be connected to the plug-in signal-conditioning module.

21. A tap device for a communications system comprising:

a tap housing faceplate portion configured to be connected to a subscriber tap portion so as to connect a subscriber device to a communications system through the tap value modification circuit module;
a tap housing access cover portion;
a tap value modification circuit module disposed between the tap housing access cover portion and the tap housing faceplate portion;
wherein the tap housing faceplate portion is configured to connect the subscriber device to the communications system through the tap value modification circuit module; and
wherein a connection between the subscriber device and the communications system is configured to be maintained upon removing the tap housing access cover portion from the tap housing faceplate portion.

22. The multi-tap device of claim 21, wherein the tap housing faceplate portion comprises a faceplate that is integral with, and non-removable from, a remainder of the tap housing faceplate portion.

23. The multi-tap device of claim 22, wherein the faceplate is positioned opposite to the tap housing access cover portion, such that the faceplate and the tap housing access cover portion face each other such that a second circuit board of the tap housing faceplate portion is configured to be connected to an inner surface of the faceplate.

24. The multi-tap device of claim 21, further comprising one or more subscriber tap ports that are configured to be connected to the faceplate.

25. The multi-tap device of claim 21, wherein the tap value modification circuit module is configured to be removed from the tap housing without disconnecting connections between the one or more subscriber tap ports and one or more subscriber devices.

26. A multi-tap device for a cable television (CATV) system, comprising:

a faceplate configured to be connected to a subscriber tap portion;
a first circuit board configured to be connected to a tap housing;
a second circuit board configured to be in electronic communication with a subscriber network and a headend via the first circuit board, the second circuit board being connected to the faceplate and to the first circuit board;
an access cover configured to be connected to a tap housing so as to move between a closed position, where the access cover prevents the first circuit board from being disconnected from the tap housing and prevents a tap value of the multi-tap device from being changed, and an open position, where the access cover permits access to the first circuit board to subsequently remove the first circuit board from the tap housing, thereby changing a tap value of the multi-tap device; and
wherein the first circuit board and the second circuit board are configured to remain in electronic communication with the subscriber network and the headend upon removal of the access cover from the tap housing.

27. The multi-tap device of claim 26, wherein the faceplate is integral with the tap housing, and wherein the access cover is positioned on an opposing side of the tap housing from the faceplate.

28. The multi-tap device of claim 26, wherein the faceplate is configured to be connected to one or more subscriber portions that remain connected to one or more subscriber devices while upon removal of the access cover from the tap housing.

29. The multi-tap device of claim 28, wherein the second circuit board is connected to an inner side of the faceplate, and wherein the one or more subscriber tap ports are connected to an outer side of the faceplate.

30. The multi-tap device of claim 28, wherein the second circuit board comprises a splitter that is configured to remain connected to the one or more subscriber tap ports upon removal of the access cover from the tap housing.

31. A multi-tap device for a cable television (CATV) system, comprising:

an access cover;
a subscriber tap portion configured to be connected to a faceplate;
a signal-conditioning circuit module configured to be disposed between the access cover and the subscriber tap portion when the access cover is affixed to the subscriber tap portion; and
wherein the subscriber tap portion is configured to maintain electronic communication with a subscriber network and a headend via the signal-conditioning circuit module upon removal of the access cover from the subscriber tap portion.

32. The multi-tap device of claim 31, wherein the faceplate is integral with, and non-removable from, a remainder of the subscriber tap portion.

33. The multi-tap device of claim 32, wherein the faceplate is positioned opposite to the access cover such that the faceplate and the access cover face each other, and wherein the second circuit board is configured to be connected to an inner surface of the faceplate.

34. The multi-tap device of claim 32, further comprising one or more subscriber tap ports that are configured to be connected to the faceplate.

35. The multi-tap device of claim 34, wherein the first circuit board is configured to be removed from the tap housing without disconnecting connections between the one or more subscriber tap ports and one or more subscriber devices.

* * * * *